(12) United States Patent
Yakabe et al.

(10) Patent No.: US 6,756,790 B2
(45) Date of Patent: Jun. 29, 2004

(54) IMPEDANCE DETECTION CIRCUIT, IMPEDANCE DETECTION DEVICE, AND IMPEDANCE DETECTION METHOD

(75) Inventors: Masami Yakabe, Hyogo (JP); Toshiyuki Matsumoto, Hyogo (JP); Yoshihiro Hirota, Kyoto (JP); Kouichi Nakano, Hyogo (JP)

(73) Assignee: Tokyo Electron Limited, Tokyo (JP)

( * ) Notice: Subject to any disclaimer, the term of this patent is extended or adjusted under 35 U.S.C. 154(b) by 59 days.

(21) Appl. No.: 09/959,759

(22) PCT Filed: Mar. 7, 2001

(86) PCT No.: PCT/JP01/01751
§ 371 (c)(1),
(2), (4) Date: Dec. 3, 2001

(87) PCT Pub. No.: WO01/67118
PCT Pub. Date: Sep. 13, 2001

(65) Prior Publication Data
US 2002/0171454 A1 Nov. 21, 2002

(30) Foreign Application Priority Data
Mar. 7, 2000 (JP) .................................... 2000-062504

(51) Int. Cl.[7] .................. G01R 27/00; G01R 35/00; G01R 27/28; G01R 27/26
(52) U.S. Cl. .................. 324/649; 324/600; 324/601; 324/684
(58) Field of Search ............................ 324/600, 601, 324/649, 684

(56) References Cited
U.S. PATENT DOCUMENTS

| | | | |
|---|---|---|---|
| 4,473,796 A | 9/1984 | Nankivil | 324/57 R |
| 4,498,044 A | 2/1985 | Horn | 324/65 R |
| 4,797,620 A | 1/1989 | Williams | 324/458 |
| 5,416,470 A | 5/1995 | Tanaka et al. | 340/660 |
| 5,469,070 A * | 11/1995 | Koluvek | 324/713 |
| 5,515,723 A | 5/1996 | Tsuchida et al. | 73/335.02 |
| 5,701,101 A | 12/1997 | Weinhardt et al. | 327/561 |
| 5,808,516 A | 9/1998 | Barber | 330/282 |
| 5,886,529 A | 3/1999 | Wakamatsu | 324/601 |
| 6,020,264 A | 2/2000 | Lustig et al. | 438/692 |
| 6,054,867 A | 4/2000 | Wakamatsu | 324/650 |
| 6,145,384 A * | 11/2000 | Ikeda et al. | 73/780 |
| 6,194,888 B1 | 2/2001 | Matsumoto et al. | 323/364 |
| 6,326,795 B1 | 12/2001 | Matsumoto et al. | 324/679 |
| 6,331,780 B1 | 12/2001 | Hiroshima et al. | 324/684 |
| 6,335,642 B1 | 1/2002 | Hiroshima et al. | 327/102 |

FOREIGN PATENT DOCUMENTS

| | | |
|---|---|---|
| JP | 09-280806 | 10/1997 |
| JP | 10-010170 | 1/1998 |
| JP | WO 99/38019 | 7/1999 |
| JP | 0 980 004 A2 | 8/1999 |
| JP | WO 99/40447 | 8/1999 |

* cited by examiner

Primary Examiner—N. Le
Assistant Examiner—John Teresinski
(74) Attorney, Agent, or Firm—Barnes & Thornburg LLP (57) ABSTRACT

A second operational amplifier (11) of a core unit (1) shorts an inverting input terminal and an output terminal. A signal line (19) is connected to a non-inverting input terminal. A capacitive sensor (18) is connected to the signal line (19). A first operational amplifier (12) earths the non-inverting input terminal. One end of a first resistance (15) and one end of a second resistance (16) are respectively connected to the inverting input terminal. The other end of the first resistance (15) is connected to an alternate current voltage generator (14). The other end of the second resistance (16) is connected to the output terminal of the first operational amplifier (11). A signal output terminal (21) of the core unit (1) is connected to an inverting amplification device (2). An alternate output terminal (22) of the core unit (1) and an inverting output terminal (42) of the inverting amplification device (2) are connected to an addition device (3). The non-inverting input terminal of operational amplifiers (36) and (40).

29 Claims, 8 Drawing Sheets

IMPEDANCE DETECTION CIRCUIT, IMPEDANCE DETECTION DEVICE, AND IMPEDANCE DETECTION METHOD

BACKGROUND ART

The present invention relates to an impedance detection circuit, an impedance detection device and an impedance detection method which are useful for detecting impedance that an impedance element such as a capacitive sensor has.

Figure 15:
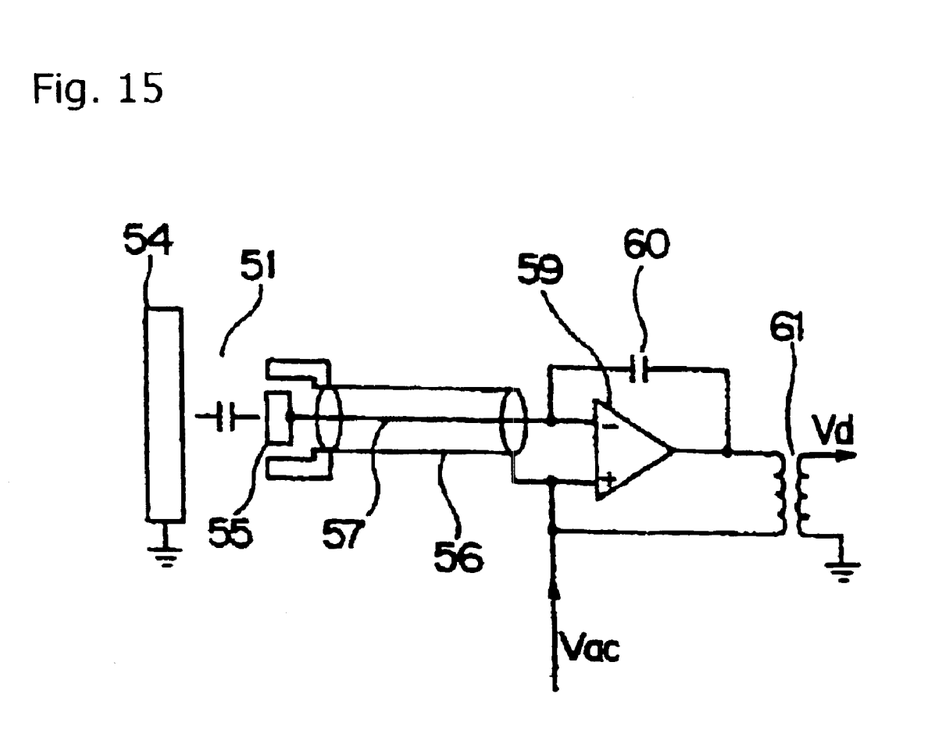
FIG. 15 is a circuit diagram showing an example of a conventional impedance detection circuit.

As a prior art of an impedance detection circuit, that described in Japanese Laid-Open Patent Application H09-280806 gazette can be cited. FIG. 15 is a circuit diagram that shows this prior art impedance detection circuit. In this detection circuit, a capacitive sensor 51 comprised of electrodes 54 and 55 is connected to an inverting input terminal of an operational amplifier 59 via a signal line 57. And a condenser 60 is connected between an output terminal of this operational amplifier 59 and the said inverting input terminal, and further an AC voltage Vac is applied to a non-inverting input terminal. Also, the said signal line 57 to which the capacitive sensor 51 is connected is wrapped up by a shield line 56 and shielded electrically. And this shield line 56 is connected to the non-inverting input terminal of the operational amplifier 59. Output voltage Vd is obtained from an output terminal of the said operational amplifier 59 via a transformer 61.

DISCLOSURE OF INVENTION

An impedance detection circuit according to the present invention comprises at least a voltage follower, a first operational amplifier, a signal line of which one end is connected to an input terminal of the voltage follower and the other end is connected to an impedance element, a shield that shields electrically at least a part of the signal line, a shield voltage applying device that applies shield voltage to this shield, a first impedance that is connected between an output terminal of the first operational amplifier and the signal line, and a signal output terminal that is connected to the output terminal of the first operational amplifier.

Also, the impedance detection circuit according to the present invention comprises at least a first operational amplifier, a second operational amplifier of which both input terminals are in an imaginary short status, a signal line of which one end is connected to one of the input terminals of the second operational amplifier and the other end is connected to an impedance element, a shield that shields electrically at least a part of the signal line, a first impedance that is connected between the output terminal of the first operational amplifier and the signal line, and a signal output terminal that is connected to the output terminal of the first operational amplifier.

Further, the impedance detection device according to the present invention comprises at least the impedance detection circuit, and a terminal that can connect the impedance element to the signal line from outside. In this case, a shield that shields electrically at least a part of a board on which the impedance detection circuit is mounted may further be comprised, and the shield voltage may be applied to the shield.

An impedance detection method according to the present invention includes steps for connecting one of the input terminals of the voltage follower to the signal line and making it into the condition of neither input nor output of current at the input terminal, applying the shield voltage based on the output voltage of the voltage follower to the shield of at least a part of the signal line, and detecting a impedance of a impedance element by the current that flows through the first impedance connected to the signal line.

Also, the impedance detection method according to the present invention includes steps for making both of the input terminals of the second operational amplifier imaginary short, connecting one of the input terminals to the signal line and making it into the condition of neither input nor output of current at the input terminal, connecting the other input terminal to the shield of at least a part of the signal line, and detecting a impedance of a impedance element by amplifying the voltage applied to the impedance element by the first impedance and the first operational amplifier connected to the signal line.

DETAILED DESCRIPTION OF THE INVENTION

In the inventors' relevant experiment approximating to the above-mentioned prior art, they found that the phenomenon that when the capacitance of the sensor 51 is decreased (an order of $10^{-15}$ F, for example), expected accurate output voltage Vd cannot be obtained and an error is increased. Therefore, the inventors made a study of this phenomenon again and again. And as a result, they came to understand the following:

The operational amplifier 59 of the above-mentioned prior art is in an imaginary short status, and AC voltage Vac is applied to the input terminal thereof. It was found, however, that a subtle displacement of a phase and amplitude arises between the voltage of the inverting input terminal and that of the non-inverting input terminal due to a tracking error in the operational amplifier 59 particularly when the voltage of the non-inverting input terminal of the operational amplifier 59 is fluctuated with a high frequency AC voltage Vac. And it was also found that this displacement causes the phenomenon that the harmonic wave of the above-mentioned AC voltage Vac is superposed on the output voltage of the operational amplifier 59, which is one of the causes of the error. Further, it was found that fluctuation arises when the operational amplifier 59 is operated at high frequency because one operational amplifier 59 has two functions of an imaginary short and gain.

As the result of the above, it was found that the error arises in the output voltage Vd under the influence of stray capacitance because the stray capacitance exists to a not-negligible extent between the signal line 57 and the shield line 56 when the capacitance of the capacitive sensor 51 is very small only if the potential of the signal line 57 is made equal to that of the shield line 56 by use of the imaginary short of the operational amplifier 59, as described in the above-mentioned prior art.

On the other hand, as the sensor manufacturing technology has developed recently, such sensors as have very small impedance of $10^{-15}$ F order as mentioned above, for example, or can detect the change of the order have been introduced. If this kind of sensor is used, it is easy to monitor a minute physical phenomenon which was difficult to be monitored in the past. Therefore, there has been more and more necessity of a circuit and device that can detect very small impedance or the change the very small impedance of these sensors accurately.

It is accordingly an object of the present invention to meet the necessity, solve the above-mentioned problems, and provide an impedance detection circuit, an impedance detection device and an impedance detection method that is useful for detecting very small impedance or the change of the very small impedance accurately.

An example of the impedance detection circuit of the present invention comprises a voltage follower and a first operational amplifier, and also comprises at least a signal line of which one end is connected to the input terminal of the voltage follower and an impedance element can be connected to the other end thereof, a shield that electrically shields at least a part of the signal line, a shield voltage applying device that applies shield voltage to the shield, first impedance that is connected between the output terminal of the first operational amplifier and the signal line, and a signal output terminal that is connected to the output terminal of the first operational amplifier.

Also, an example of the impedance detection circuit of the present invention comprises at least a first operational amplifier, a second operational amplifier of which both input terminals are in an imaginary short status, a signal line of which one end is connected to one input terminal of the second operational amplifier and an impedance element can be connected to the other end thereof, a shield that electrically shields at least a part of the signal line, a first impedance that is connected between the output terminal of the first operational amplifier and the signal line, and signal output terminal that is connected to the output terminal of the first operational amplifier. Note that a shield voltage applying device may be connected to this shield.

In these examples, the shield voltage applying device may include a phase amplitude compensation device, and one of the input terminals of the first operational amplifier may be connected to a specified first voltage.

Further, an example of the impedance detection circuit of the present invention may comprise a cancel device that removes the output voltage of the voltage follower or the second operational amplifier from the output voltage of the signal output terminal. Here, an example of the cancel device may comprise an inverting amplification device that inverts one of the two output voltages by using a third operational amplifier, and an addition device that adds up the other output voltage and the output voltage of the inverting amplification device. Also, an example of the cancel device may comprise an inverting amplification device that inverts one of the two output voltages, and an addition device that adds up the other output voltage and the output voltage of the inverting amplification device by using a fourth operational amplifier. In this way, it is possible to substitute the inverting amplification device for the addition device. And one of the input terminals of the third operational amplifier and/or the fourth operational amplifier may be connected to a specified first voltage. In addition, the inverting amplification device may comprise a phase amplitude compensation device.

In an example of the impedance detection circuit of the present invention, the cancel device may comprise a subtractor of which input terminals have the two types of output voltage, and further the subtraction device may comprise a fifth operational amplifier of which one input terminal is connected to a specified first voltage. In addition, the phase amplitude compensation device may be connected to the input terminal of the subtractor.

In the examples of the impedance detection circuit of the present invention, DC bias and/or AC bias may be superposed on the impedance element connected to the signal line, more specifically, on the opposite side of the impedance element to which the signal line is connected.

An example of the impedance detection circuit of the present invention may further comprise a switching device including a primary side connection terminal with at least one terminal and a secondary side connection terminal with at least two terminals. In the switching device, the primary side connection terminal is connected at least to the impedance element, the secondary side connection terminal is connected at least to the signal line and the shield, and a terminal to which the primary side connection terminal is connected varies in the terminals of the secondary side connection terminal. And, voltage in a certain relation with the voltage of one terminal of the secondary side connection terminal may be applied to the other terminal thereof. Here, the present invention does not exclude, of course, that the other device of which connection can be switched is included therein, and a plurality of the switching devices may be included.

In an example of the impedance detection circuit of the present invention, the first impedance may comprise one or more selecting devices which has a plurality of resistances and can select at least one resistance. The composition of this selecting device is similar to that of the switching device. They may be connected between the first impedance and the signal line and/or between the first impedance and the signal output terminal. Note that influence of non-selected impedance can be lessened if they are connected in both positions.

The switching devices or selecting devices in these examples of the present invention may comprise a multiplexer having a plurality of themselves. Also, these switching devices or selecting devices may be used as a changing device for changing an impedance value of the impedance portion that determines amplitude characteristics of the impedance detection circuit of the example of the present invention.

It is more preferable that the first impedance is resistance when the impedance element of the example is a resistance component and that the first impedance is capacitance when the impedance element thereof is a capacitance component, because phase or amplitude of a signal can be adjusted easily.

An example of the impedance detection device of the present invention includes at least an example of the impedance detection circuit of the present invention and a terminal that can connect an impedance element from outside to the signal line. This example may comprise a shield that electrically shields at least a part of a board on which the example of the impedance detection circuit is mounted, and the shield voltage may be applied to this shield. Also, the example of the impedance detection device may include a terminal to which the shield can be connected outside thereof, and a bias input terminal that is connected to a bias terminal so as to superpose bias on the impedance element from outside. These terminals can enhance the convenience of actual use as well as keep the accuracy of measurement.

An example of the impedance detection method includes at least a method of connecting one of the input terminals of the voltage follower to the signal line and making it into the condition of neither input nor output of current at the input terminal, applying the shield voltage based on the output voltage of the voltage follower to the shield of at least a part of the signal, and detecting the impedance of the impedance element by the electric current through the first impedance connected to the signal line.

Also, an example of the impedance detection method includes at least the method of making both input terminals of the second operational amplifier an imaginary short, connecting one of the input terminals to the signal line and making it into the condition of neither input nor output of current at the input terminal, connecting the other input terminal to the shield of at least a part of the signal line, and detecting the impedance of the impedance element of the impedance element by the electric current through the first impedance connected to the signal line. In this case, it is more preferable that shield voltage is applied to the shield.

In these examples of the impedance detection method, the shield voltage may further be the voltage which is compensated in phase and amplitude and applied to the shield.

Further, the output of the voltage follower or the output of the second operational amplifier may be subtracted from the detection signal of the impedance element.

In addition, at least either the DC bias or AC bias may be applied to the impedance element connected to the signal line.

In these examples of the impedance detection method, a terminal to which the impedance element is connected can be switched from the signal line to the shield so as to initialize.

Likewise, the value of the first impedance can be changed to change the potential difference applied to the first impedance so as to change gain.

In the examples as described above, "an impedance element" includes not only an element as a component but also impedance and others which is formed between an object for measurement and a measurement electrode provided on the end portion of the signal line.

Also, in the examples as described above, "a specified first voltage" can be said a predetermined voltage or a certain fixed voltage, and indicates that voltage is maintained at known voltage during detection of impedance or adjustment of zero point. Grounding or earth connection is of course included, and in this case, it means that voltage is maintained at a certain fixed voltage of zero volt.

Further, in these examples described above, "a specified relation" means a predetermined relation or a known relation. For example, this relation means the relation in which either the phase or the amplitude of voltage between two terminals or both of them change at a certain fixed ratio, gradually or at random, or either or both of them are constant, and depends on the condition of whole circuit, elements to be connected to, or the surrounding circumstances.

In these examples of the impedance detection circuit, the impedance detection device or the impedance detection method, the potentials of the shield and the signal line are made to be equal by the voltage follower or the second operational amplifier, and the voltage of the signal is amplified by the first operational amplifier, thereby making it possible to divide into a part in which voltage is amplified and a part in which potential between the shield and the signal line is equal within the impedance detection circuit. Therefore, slight displacement of phases and amplitudes of the voltages between the inverting input terminal and the non-inverting input terminal caused by superposition of harmonic wave of AC voltage inputted to the signal output voltage or a tracking error in the operational amplifier can be virtually removed. As a result, influence of parasitic capacitance caused by a shield or the like can be minimized when very small or highly accurate impedance is measured. In this way, a signal that is in accurate proportion to the amount of electric current flowing through an impedance element can be obtained.

Also, in these examples of the present invention, operation of each operational amplifier is stable by connecting one of the input terminals of the operational amplifier to a specified first voltage. It is accordingly possible to control the stray capacitance between the signal line and the shield and further restrain the harmonic wave component of the voltage which appears on the output terminal of the operational amplifier depending on the electric current through the impedance element.

In these examples, the potential difference between the signal line and the shield can be controlled accurately to be a desired value by applying the voltage of which phase and amplitude are compensated to the shield even if a high frequency input signal is inputted. The potential difference between the signal line and the shield can be almost zero, for example, thereby doing away with the stray capacitance between them. Note that, in case of low frequency, the potential difference is sometimes within an acceptable range of an error without using phase and amplitude compensation, and in this case, the phase and amplitude compensation don't need to be used.

In these examples, reset or initialization can be done accurately by using the switching device either connecting with the impedance element or non-connecting thereof. Thereby, the potential difference between the impedance element and the signal line can be maintained in a specified relation. When the potential difference between the impedance element and the signal line is almost zero, for example, the stray capacitance between them can almost be removed, thereby further improving the accuracy. This is also applicable to the case using a multiplexer.

Also, when the selecting device is used, the value of the first impedance can be changed. Therefore, the potential difference imposed on the first impedance can be changed and the gain can be changed while the measurement accuracy thereof is maintained.

In the impedance detection circuit, device and method, the amplification characteristics and the gain of the circuit can be changed while the potential difference between the selected impedance and non-selected impedance is maintained in a specified relation by using the switching device or the selecting device. It is therefore possible to detect with high accuracy by changing the values even when a measurement range is switched depending on an object to be detected or measurement conditions.

In the impedance detection device, the connection with the outside impedance element can be shielded by the shield in which the potential difference from a connection line which a measurement signal runs through is accurately controlled. When the potential of the shield is equal to that of the connection line, for example, the stray capacitance between them can almost be removed. Further, in the impedance detection device, since the board itself on which the impedance detection circuit is mounted is electrically shielded by the shield, the potential difference between the signal line and the shield can be accurately controlled. When the potential difference is almost zero, for example, the stray capacitance between the signal line and the outside of the board can almost be removed, and therefore very small impedance or a very small change of impedance can be accurately detected.

THE PREFERRED EMBODIMENTS OF THE INVENTION

The following is a detailed explanation of the impedance detection circuit, the impedance detection method, and the impedance detection device according to the embodiments of the present invention with reference to figures.

Figure 1:
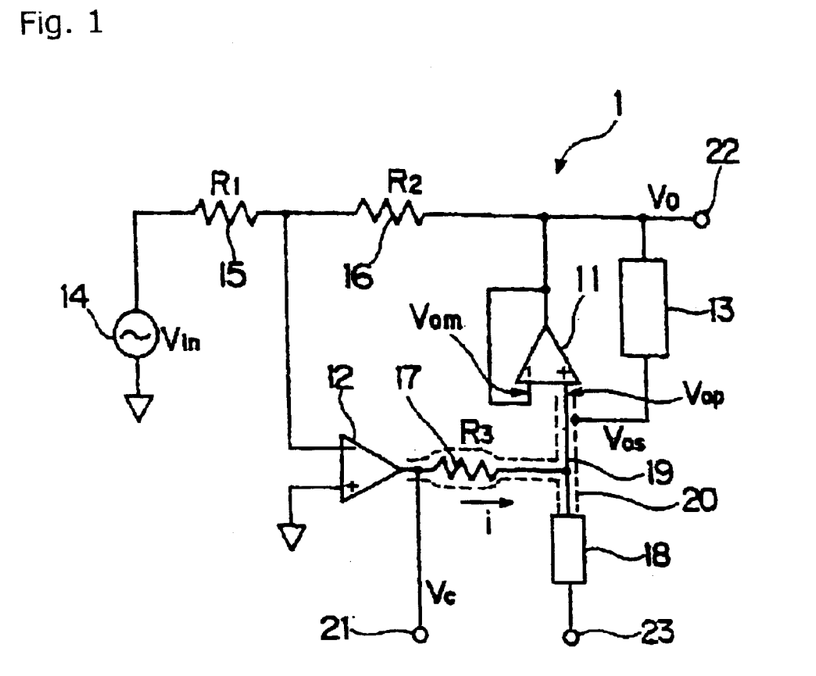
FIG. 1 is a circuit diagram showing an example of a core unit of the impedance detection circuit of one embodiment according to the present invention.

FIG. 1 is an excerpted circuit diagram showing a core unit of the impedance detection circuit of one embodiment according to the present invention. A core unit 1 includes a first operational amplifier 12 and a second operational amplifier 11. Since the inverting input terminal and output terminal of the second operational amplifier 11 is shorted, the second operational amplifier 11 can be called a voltage follower in a sense. Here, a voltage follower means a function as an impedance converter in which input impedance is high and output impedance is low, and input and output gain is 1. A signal line 19 is connected to the non-inverting input terminal of the second operational amplifier 11. And a capacitive sensor as an example of an impedance element 18 can be connected to the signal line 19. The capacitive sensor changes electrostatic capacitance Cs thereof depending on the physical quantity (acceleration, pressure, gas, light, sound wave, etc.) which the capacitive sensor sensed. Other end of the capacitive sensor connected to the signal line 19 is connected to a bias terminal 23 or earthed. Although the bias terminal 23 may be floating, more accurate measurement is possible when AC, DC or AC and DC bias voltage is applied to the bias terminal 23. More specifically, when impedance of an impedance element changes due to voltage, the detection of the impedance and C-V measurement can be done easily and highly accurately when the bias voltage is applied to the impedance element.

The non-inverting input terminal of the first operational amplifier 12 is earthed, while the inverting input terminal thereof is connected to one end of a first resistance 15 (resistance value R1) and a second resistance 16 (resistance value R2) respectively. Although it is preferred that the non-inverting input terminal is earthed as mentioned above, it is fine when voltage is maintained at a certain level such as zero potential. As long as the bias voltage is maintained at a certain voltage even if the bias voltage is applied to the non-inverting input terminal, so-called electric instability of the operational amplifier can be restrained. Therefore, such a method may be used. And the other end of the first resistance 15 is connected to a AC voltage generator 14 (generated AC voltage Vin, angular frequency ω), and the other end of the second resistance 16 is connected to the output terminal of the second operational amplifier 11.

Figure 8:
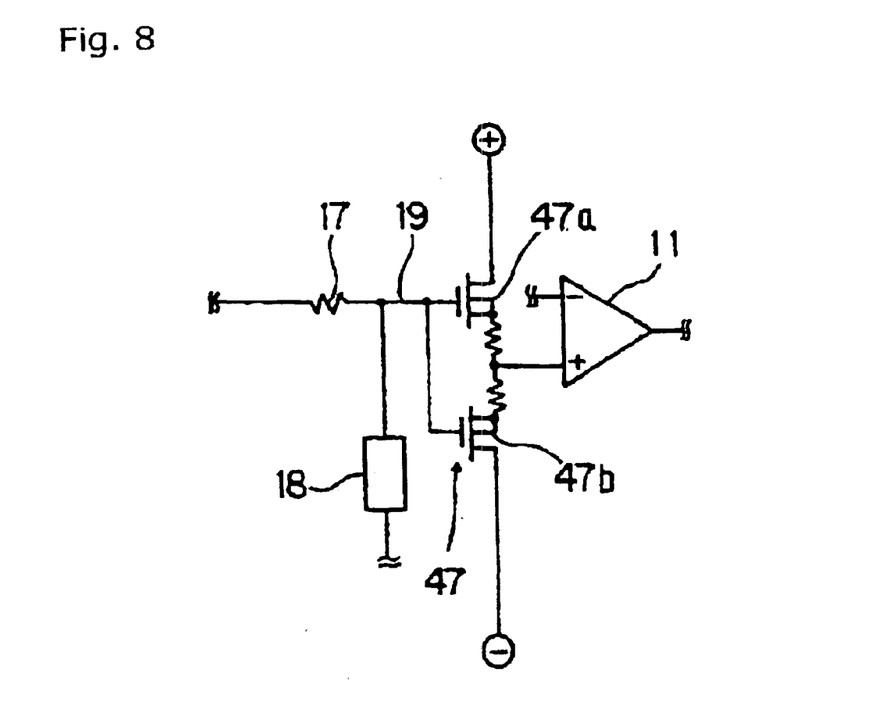
FIG. 8 is a circuit diagram showing an example of the input side of the voltage follower or the second operational amplifier which is indicated in FIG. 1, FIG. 2 or FIG. 3, for example.

The output terminal of the first operational amplifier 12 is connected to the non-inverting input terminal of the second operational amplifier 11 via a third resistance 17 (the resistance value of the first impedance R3). The signal line 19 and the third resistance 17 that connect the output terminal of the first operational amplifier 12, the non-inverting input terminal of the second operational amplifier 11 and the capacitive sensor with each other are shielded with a shield 20. The shield 20 electrically shields the signal line 19 from outside. And the shield 20 is connected to the output terminal of the second operational amplifier 11 via a shield voltage applying device including a compensation circuit 13. Also, a signal output terminal 21 is connected to the output terminal of the first operational amplifier 12, and an AC output terminal 22 is connected to the output terminal of the second operational amplifier 11. Further, although it is not shown in FIG. 1 to avoid complexity, an N-type MOSFET 47A and a P-type MOSFET 47B which are connected between positive and negative power sources as shown in FIG. 8 as an example are connected as an analog buffer 47 to the non-inverting input terminal of the second operational amplifier 11. And the input of the analog buffer 47 is connected to the signal line 19, thereby making the impedance extremely high seen from the side of the signal line 19.

Figure 2:
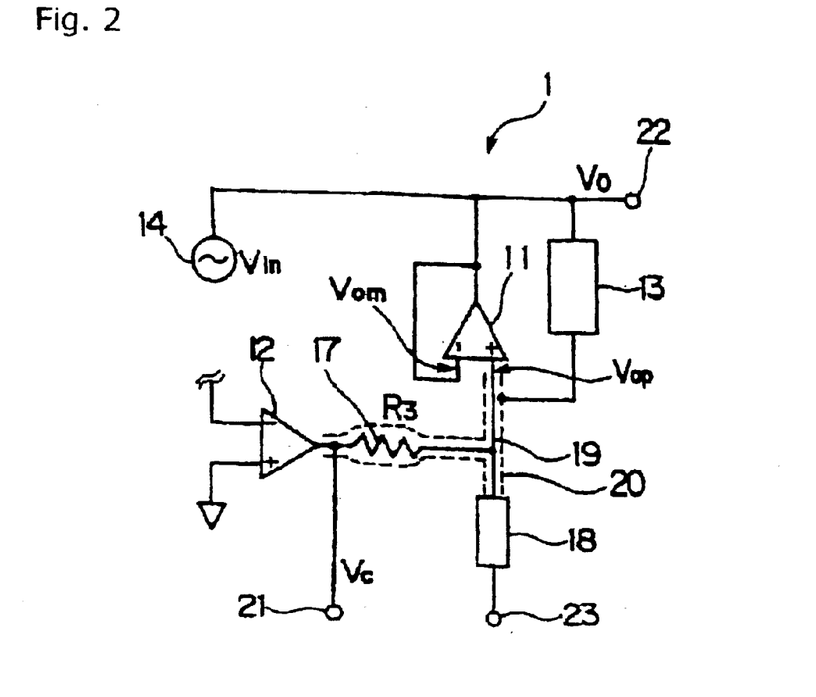
FIG. 2 is a circuit diagram showing an example of the core unit of the impedance detection circuit of one embodiment according to the present invention.

FIG. 2 is the other embodiment of the core unit of the impedance detection circuit according to the present invention. This is same as FIG. 1 except that the AC voltage generator 14 is not connected to the non-inverting input terminal of the first operational amplifier 12. This structure is possible as an example of the core unit 1.

Figure 9:
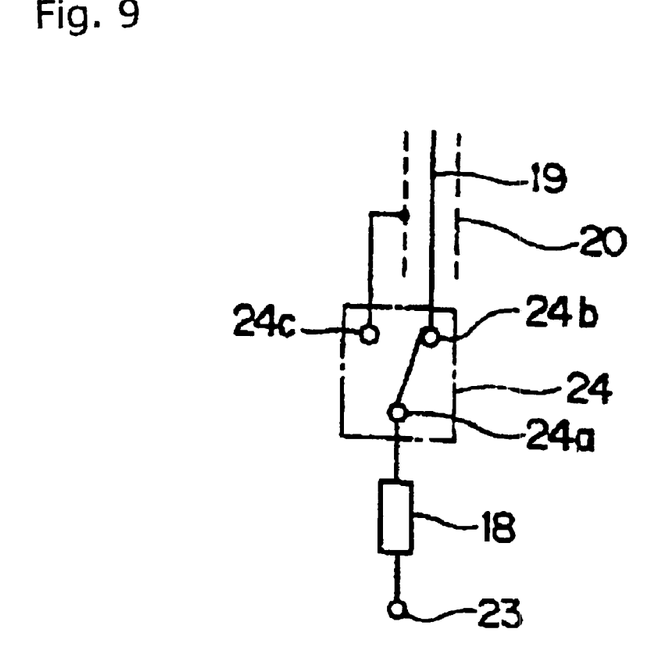
FIG. 9 is a circuit diagram showing an example of the end portion of the signal line which is indicated in FIG. 1, FIG. 2 or FIG. 3, for example.

FIG. 9 shows in detail the connection part between the signal line 19 and the capacitive sensor as the impedance element 18 in the core unit 1. A switch (a switching device) 24 is provided in the connection part. This switch 24 switches connection of a primary side connection terminal 24a between two terminals, a secondary side connection terminal 24b and 24c. The signal line 19 is connected to the secondary side connection terminal 24b of the switch 24, and the shield 20 is connected to the secondary side connection terminal 24c. And, one end of the capacitive sensor can be connected to the primary side connection terminal 24a of the switch 24.

Figure 7:
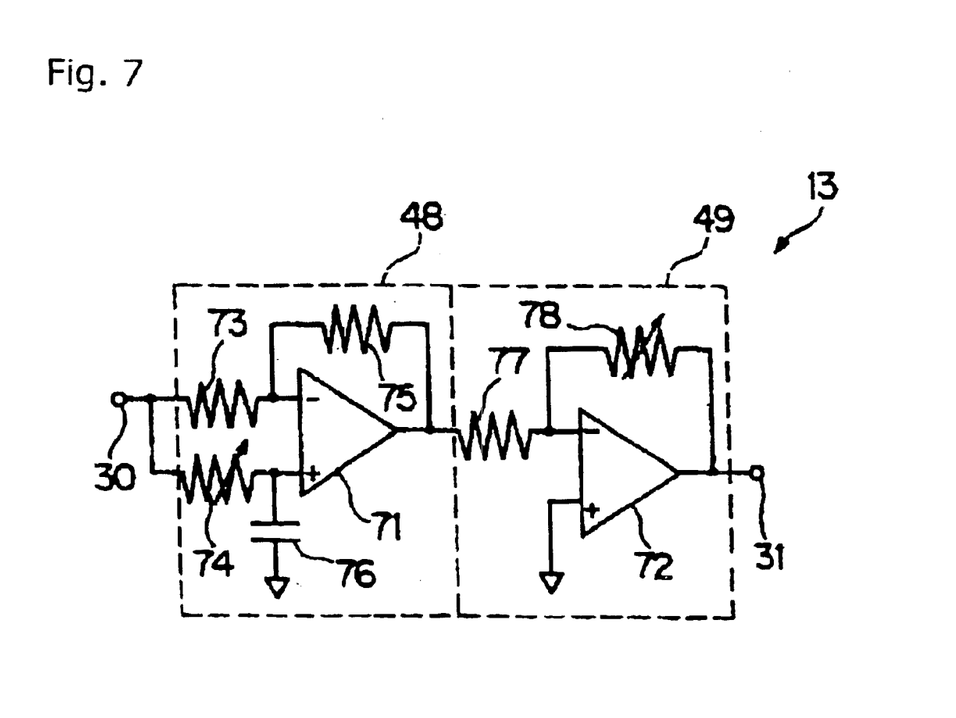
FIG. 7 is a circuit diagram showing an example of the amplitude phase compensation device which is indicated in FIG. 1, FIG. 2 or FIG. 6, for example.

FIG. 7 is a circuit diagram showing an example of a compensation circuit 13 provided in the core unit 1. The compensation circuit 13 comprises a phase adjustment unit 48 and an amplitude adjustment unit 49. The phase adjustment unit 48 is structured as all band pass filter using an operational amplifier 71. That is, a resistance 73 is connected between the input terminal 30 and the non-inverting input terminal of the operational amplifier 71, and a variable resistance 74 is connected between the input terminal 30 and the inverting input terminal. Also, a resistance 75 is connected between the output terminal of the operational amplifier 71 and the inverting input terminal, and further a condenser 76 is connected to the non-inverting input terminal of the operational amplifier 71. In this example, the resistance values of the resistance 73 and the resistance 75 are equal. And the output side of the phase adjustment unit 48 is connected to the input side of the amplitude adjustment unit 49. The amplitude adjustment unit 49 is also structured as an inverting amplifier using the operational amplifier 72. That is, a resistance 77 is connected between the input of the phase adjustment unit 49 and the inverting input terminal of the operational amplifier 72, a variable resistance 78 is connected between the output terminal of the operational amplifier 72 and the inverting input terminal, and the non-inverting input terminal of the operational amplifier 72 is earthed.

Figure 3:
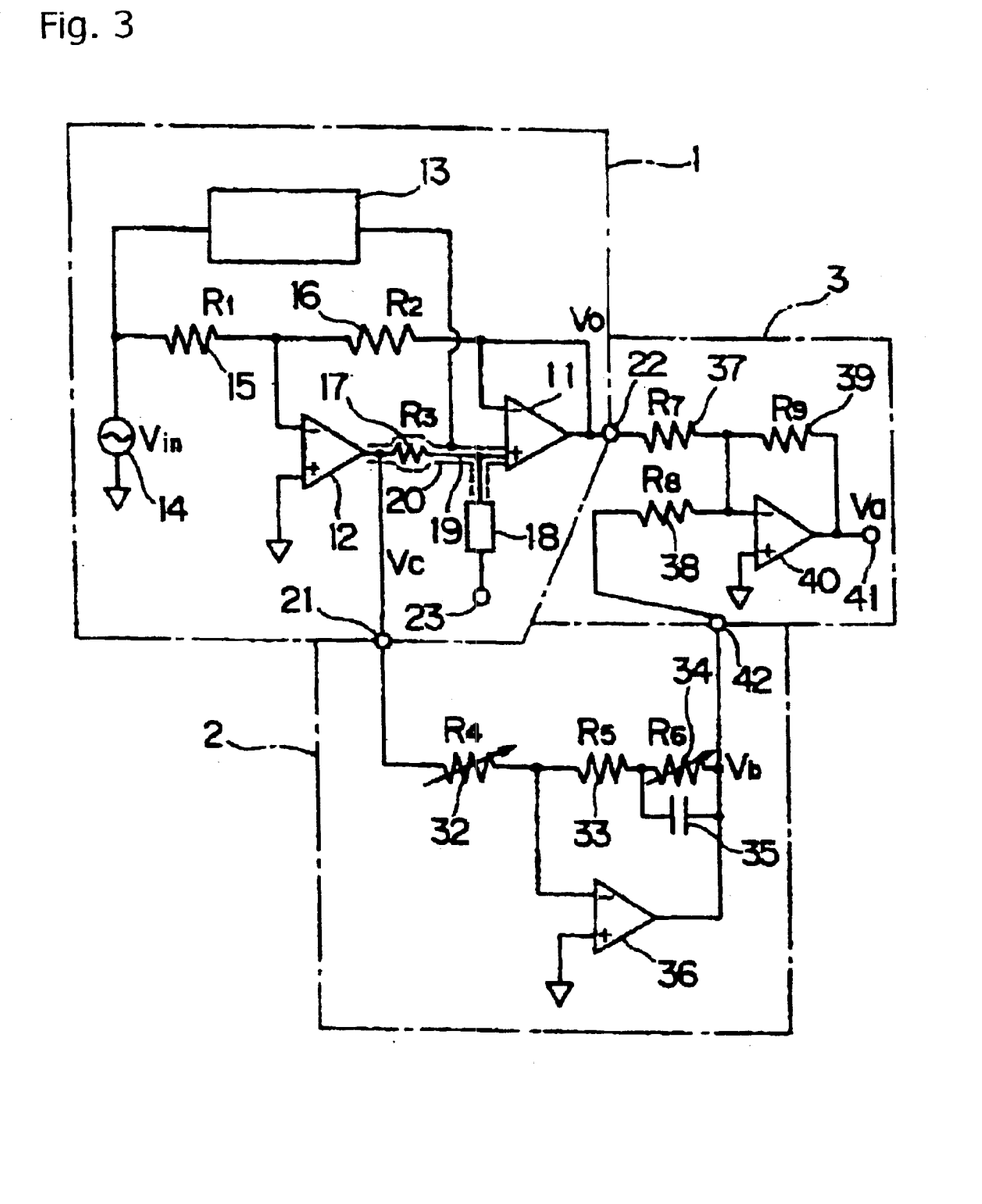
FIG. 3 is a circuit diagram showing an example of the impedance detection circuit of one embodiment according to the present invention.

FIG. 3 is a circuit diagram showing an example of the whole impedance detection circuit. Although the input side of the compensation circuit 13 is connected to the output terminal of the second operational amplifier 11 in the core unit 1 as shown in a circuit diagram of FIG. 1, the input side of the compensation circuit 13 is connected to the AC voltage generator 14 in the core unit 1 in this circuit diagram. As described later, even if the input side of the compensation circuit 13 is connected in this way, the phase and amplitude of the output voltage of the second operational amplifier 11 can be compensated and applied to the shield 20. An inverting amplification device 2 with a third operational amplifier 36 is connected to the signal output terminal 21 of the core unit 1 in this example. The signal output terminal 21 is connected to the inverting input terminal of the third operational amplifier 36 via a fourth resistance 32 (resistance value R4) of which value is variable. And, a fifth resistance 33 (resistance value R5) and a sixth resistance 34 (resistance value R6) of which value is variable are connected in series in order from the inverting input terminal side between the inverting input terminal and the output terminal of the third operational amplifier 36, and further a condenser 35 is connected in parallel with the sixth resistance 34. Also, the non-inverting input terminal of the third operational amplifier 36 is earthed.

Further, the AC output terminal 22 of the core unit 1 in this example and the inverting output terminal 42 of the inverting amplification device 2 are connected to an addition device 3 with the fourth operational amplifier 40. The AC output terminal 22 and the inverting output terminal 42 are connected to the inverting input terminal of the fourth operational amplifier 40, via a seventh resistance 37 (resistance value R7) and eighth resistance 38 (resistance value R8), respectively. And the inverting input terminal and the output terminal of the fourth operational amplifier 40 is connected at a ninth resistance 39 (resistance value R9), and the output terminal is connected to an addition output terminal 41. Also, the non-inverting input terminal of the fourth operational amplifier 40 is earthed.

Figure 10:
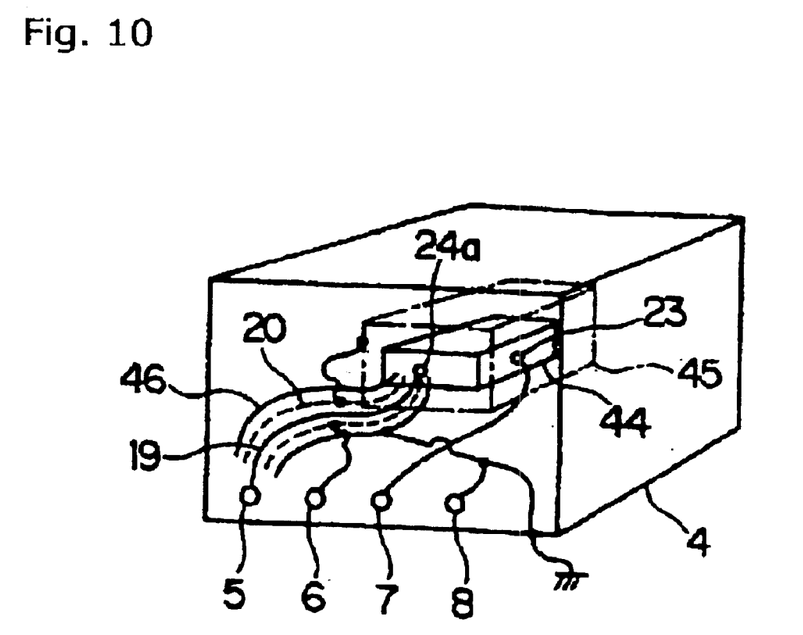
FIG. 10 is a model of a transparent perspective view showing an example of the impedance detection device of one embodiment according to the present invention.

FIG. 10 is a model of transparent perspective view showing the impedance detection device comprising the above example of the impedance detection circuit. A board 44 on which the impedance detection circuit is mounted is provided in a shield case 45 (shield) that electrically shields the inside thereof, and the shield case 45 is further placed in a device casing 4 (shield) that electrically shields. The device casing 4 is equipped with an impedance connection terminal 5, a shield terminal 6, a bias input terminal 7 and an earth terminal 8 respectively. The signal line 19 which is connected to a terminal 24A of the switch 24 extends from the board 44 and connected to the impedance connection terminal 5. Although the signal line 19 is wrapped up by the shield 20, the outside of the shield 20 is further wrapped up by a second shield 46 (shield) and electrically shielded. The shield 20 is connected to the shield case 45 and the shield terminal 6. Also, the device casing 4 and the second shield 46 are connected to the earth terminal 8, thereby the device casing 4 being earthed. The bias input terminal 7 is connected to the bias terminal 23 of the detection circuit. Note that the bias input terminal 7 may not be connected when the bias terminal 23 is floating or earthed.

Next, the operations of the impedance detection circuit and the impedance detection device as structured as in the above examples will be explained. First, the capacitive sensor as an example of the impedance element 18 is connected to the end portion of the signal line 19 running from the impedance connection terminal 5. A double shield cable is used for this connection. An axis line of the cable is used for the connection of the capacitive sensor, and an inside shield is connected to the shield terminal 6. An outside shield may be connected to the earth terminal 8, the shield terminal 6, or others appropriately depending upon the length and the type of the cable, or the operational circumstances, and so on. Also, the bias input terminal 7 is connected with the earth terminal 8 in this example.

Assume that the impedance of the capacitive sensor is Z. In the core unit 1, the voltage Vo of the AC output terminal 22 is expressed as follows:

$$Vo = -(R2/R1) \cdot Vin \tag{1}$$

That is, an amplification circuit that makes the voltage follower output the voltage Vo obtained by amplifying the input voltage Vin output from the output terminal is comprised of the first operational amplifier 12, the voltage follower including the operational amplifier 11, the first resistance 15, and the second resistance 16. In other words, it can be said that the amplification circuit is comprised of the second operational amplifier 11 of which both input terminals are in the imaginary short status, and the first operational amplifier 12.

If the resistances 32, 33, 34 are set so that the gain of the inverting amplification device 2 is −1, the voltage Vb of the inverting output terminal 42 is expressed as follows:

$$Vb = -Vc$$

Further, when the attention is paid only to the addition device 3 for calculation, the voltage Va of the addition output terminal 41 is expressed as follows:

$$Va = -R9 \cdot ((Vo/R7) + (Vb/R8))$$

So when the relation of each resistance is R7=R8=R9, Va is expressed as follows:

$$Va = -(Vo + Vb) \tag{2}$$
$$= -(Vo - Vc)$$
$$= Vc - Vo$$

Therefore, it is found that the cancel device is comprised of the inverting amplification device 2 and the addition device 3.

Here, assuming that the electric current through the third resistance 17 toward the capacitive sensor is i, Vo=Z·i is established because almost all of the current i flows through the capacitive sensor by the functions such as the voltage follower and the imaginary short, and the voltage Vc of the detection signal outputted from the signal output terminal 21 is expressed as follows:

$$Vc = i \cdot R3 + Vo$$
$$= (1 + R3/Z) \cdot Vo$$

So, it is found that the detection signal Vc includes Vo which appears on the output terminal of the second operational amplifier. When this is transformed using the expressions (1) and (2), the following is established:

$$Va = Vc - Vo$$
$$= (1 + R3/Z) \cdot Vo - Vo$$
$$= (R3/Z) \cdot Vo$$
$$= -(R3 \cdot R2/(Z \cdot R1)) \cdot Vin$$

Since Z=1/(jωCs), the voltage Va is after all expressed as follows:

$$Va = -(j\omega Cs \cdot R3 \cdot R2/R1) \cdot Vin$$

Therefore, the voltage value Va in proportion to the capacitance value Cs of the capacitive sensor is obtained from the addition output terminal 41. Accordingly, various kinds of signal processing depending on the voltage Va which is taken out of the addition output terminal 41 make it possible that the accurate capacitance value Cs is obtained.

The second operational amplifier 11 operates by making the inverting input terminal and the non-inverting input terminal thereof the imaginary short status. However, since the input impedance of the second operational amplifier 11 is not ideally infinite large, very small differences of the amplitude and the phase arise between the voltage Vom of the inverting input terminal and the voltage Vop of the non-inverting input terminal, as mentioned above. And the higher the frequency of the input signal is, the larger these differences of the amplitude and the phase are. When Vin is a high frequency of $10^9$Hz order and the capacitance Cs of the capacitive sensor is about $10^{-15}$F order, for example, the differences of the amplitude between the voltage Vom and the voltage Vop and the phase cannot be ignored. Therefore, even if Cs is zero, Vo=−Vb is not established, and a measurement error arises. So, before the capacitance value Cs of the capacitive sensor is measured, the primary side connection terminal 24A of the switch 24 is switched to the secondary side connection terminal 24C connected to the shield 20, thereby the capacitive sensor is removed from the non-inverting input terminal of the second operational amplifier 11. And under this condition, the impedance detection circuit is made to operate. Here, the fourth resistance 32 of the inverting amplification device 2 is adjusted to match the amplitude of Vb with Vo so that Vo=−Vb, that is, Va=0 is established, and the sixth resistance 34 connected to the capacitance in parallel is adjusted to turn the phase of Vb so as to match it with −Vo. That is, it shows that the inverting amplification device 2 can function as zero adjustment means.

As described above, although there are very small differences of the phase and the amplitude between Vom and Vop, both are signals synchronized with the AC voltage Vin. So, the phase of Vin is adjusted by a variable resistance 74 mounted in a phase adjustment unit 48 of the compensation circuit 13, and the amplitude of Vin is adjusted by a variable resistance 78 mounted on the amplitude adjustment unit 49, thereby forming shield voltage Vos of which phase and amplitude are equal to those of Vop. That is, the shield voltage generator includes at least the AC voltage generator 14 and the compensation circuit 13.

In the circuit example as shown in FIG. 1, the input side of the compensation circuit 13 is connected to the output terminal of the second operational amplifier 11. The output voltage Vo of the second operational amplifier 11 is a signal synchronized with the AC voltage Vin in both FIG. 1 and FIG. 3. And, the non-inverting input terminal, that is, the voltage of the signal line 19, and the output voltage Vo are almost equal by the imaginary short. Compensating the phase and amplitude of Vin and applying it to the shield 20 as shown in FIG. 3 is, therefore, functionally equivalent to applying a signal obtained by compensating the phase and amplitude of the output voltage Vo to the shield 20 as shown in FIG. 1. Since Vin that is the input signal of the detection circuit has less noise component than Vo that is the output of the voltage follower, more accurate detection is possible when the phase and amplitude of Vin is compensated to form Vos and then applied to the shield 20. Thereby, the voltage of the shield 20 is equal to the voltage of the signal line 19 even in a moment, and the stray capacitance between the signal 19 and the shield 20 can be cancelled without fault.

In the examples of the impedance detection circuit and the impedance detection device, the amplitude and the phase of the AC voltage Vin (or the output voltage Vo of the voltage follower) is compensated in the compensation circuit 13 so as to form the shield voltage Vos of which phase and amplitude are equal to those of the voltage Vop of the signal line 19, and then applied to the shield 20. Therefore, even if Vin is not only a low frequency of several kHz~ some hundreds kHz but a high frequency of $10^9$Hz or more, for example, the stray capacitance between the signal line 19 and the shield 20 can almost be cancelled without fault, and only the capacitance Cs of the capacitive sensor can be accurately detected.

Here, since all the terminals performs AC operations in the second operational amplifier 11, an operational error due to instability or the like increases when only the second operational amplifier 11 is used to obtain a large gain. As a result, the measurement value of the capacitance value Cs includes an error. In these examples, the inverting input terminal and the output terminal of the second operational amplifier 11 are shorted in order to prevent the error, they are functioned as a voltage follower of a gain=1 approximately. And a necessary gain is obtained by the first operational amplifier 12. Therefore, Cs can be accurately measured. Also, the non-inverting input terminal of the first operational amplifier 12 that performs amplification is earthed. Since the voltage of the non-inverting input terminal is stable when it is earthed, a harmonic wave included in the output signal can be restrained particularly while the high-speed operation of the operational amplifier is being performed. Note that a certain voltage may be applied to the terminal in addition to earth connection as long as the voltage of the terminal is stable. Thereby, a harmonic wave component of Va which was a cause of an error in the prior art can be largely reduced, and the accuracy of measurement can also be improved remarkably. Therefore, Cs can be measured much more accurately.

Figure 4:
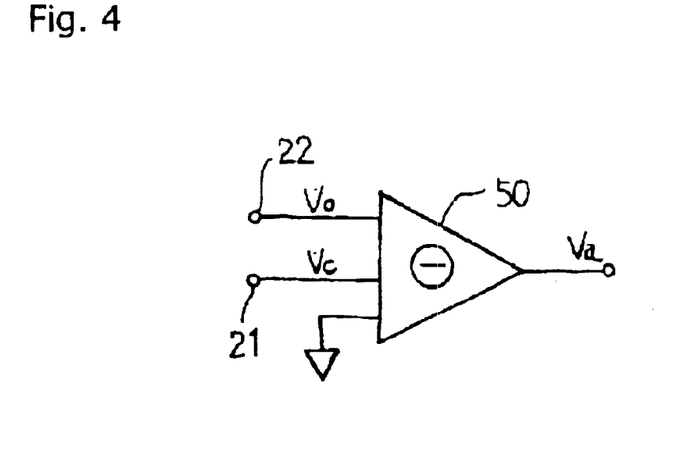
FIG. 4 is a circuit diagram showing an example of a part of the impedance detection circuit of one embodiment according to the present invention.
Figure 5:
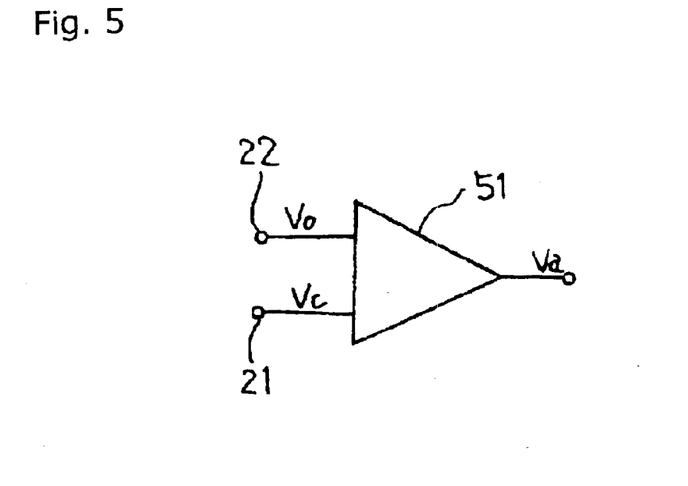
FIG. 5 is a circuit diagram showing an example of a part of the impedance detection circuit of one embodiment according to the present invention.
Figure 6:
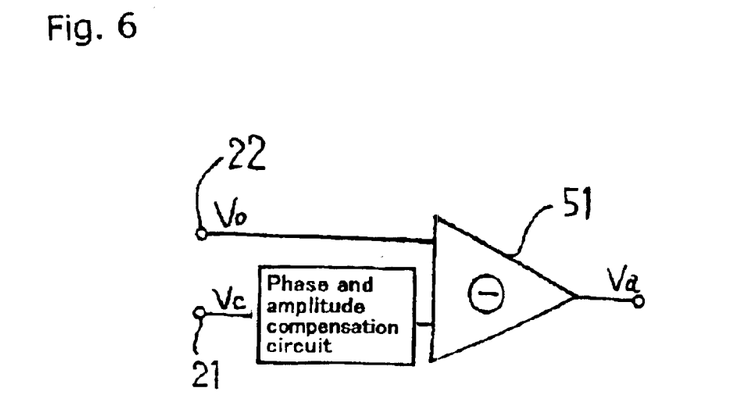
FIG. 6 is a circuit diagram showing an example of a part of the impedance detection circuit of one embodiment according to the present invention.

In the examples as shown in FIG. 3~FIG. 6, the voltage Va in proportion to Cs can be obtained by subtracting Vo from Vc. That is, only the electric current through the capacitive sensor can be detected. As a result, the following signal processing circuit required for a calculation of Cs can be simplified, and thereby occurrence of a cause of an error can be drastically restrained. A direct subtractor is often used to subtract Vo from Vc, as shown in FIG. 4, FIG. 5 and FIG. 6. In this case, Vc and Vo are directly applied to the input terminals of the fifth operational amplifiers 50 and 51. For stabilization, one terminal may be earthed or maintained at a specified voltage, as shown in the operational amplifier 50. In addition, as shown in FIG. 6 where a phase and amplitude compensation circuit is connected to the input side of Vc, the phase and amplitude compensation circuit may be added to either one of the input terminals. On the other hand, as shown in FIG. 3, Vc may be inverted and then added to Vo in order to subtract Vo from Vc. It is preferable for stabilizing the operations of an operational amplifier with a high accuracy that the non-inverting input terminal of the operational amplifier is earthed or maintained at a certain fixed voltage. And so, when an inverting amplifier and an adder are comprised as shown in this example, the condition can be maintained by earthing the non-inverting input terminals of the operational amplifiers or applying a certain fixed voltage. In this example, the non-inverting input terminal of the third operational amplifier 36 comprised in the inverting amplification device 2 and that of the fourth operational amplifier 40 comprised in the addition device 3 are earthed respectively. In case of a high-speed operation, since the operations of the operational amplifiers are stabilized if the non-inverting input terminals are maintained at a predetrmined voltage, it is preferable that these terminals are connected to such a predetermined voltage. As a result, the harmonic wave which can be included in the output voltage Va of the operational amplifier 40 can be restrained, thereby realizing more accurate measurement of Cs.

The second operational amplifier 11 operates by making the inverting input terminal and the non-inverting input terminal the imaginary short status. However, as described above, the phase difference and the amplitude difference may arise between the voltages Vom and Vop of both the input terminals thereof. Therefore, even if the amplification degree of the inverting amplification device 2 and the addition device 3 can be accurately set to be "1", it is sometimes the case that Va=0 is not established in case of Cs=0. So, in the example as shown in FIG. 3, the phase and amplitude of Vc can be adjusted in the inverting amplification device 2, thereby realizing zero point adjustment so as to establish approximately Va=0 in case of Cs=0. Also, the phase adjustment here is not made by the all band pass filter that connects a condenser to the non-inverting input terminal of the operational amplifier, but by the inverting amplifier in which the non-inverting input terminal of the operational amplifier is earthed and the capacitance component is provided in the feedback circuit. Therefore, the harmonic wave which may be included in the output signal is restrained, thereby preventing the degradation of measurement accuracy of Cs.

Zero adjustment is performed under the condition that the connection of the above-mentioned capacitive sensor is separated. However, when this separation is done by an ordinary switch, accurate zero adjustment cannot be done due to the stray capacitance which arises between the separated capacitive sensor and the signal line 19. Therefore, in this example of the impedance detection circuit, the capacitive sensor separated from the signal line 19 can be connected with the shield 20 by the switch 24. Since the voltage Vos applied on this shield 20 is equal to the voltage Vop of the signal line 19, accurate zero adjustment can be realized without producing the stray capacitance between the signal line 19 and the capacitive sensor separated from the signal line 19.

Further, according to the example of the impedance detection device as shown in FIG. 10, the shield 20 which shields the signal line 19 is further shielded by a second shield line 46. When a cable is short, this second shield line 46 is earthed to prevent the shield 20 on which the voltage Vos is applied from being superposed by the disturbance noise. Therefore, the signal line 19 and the shield 20 can be maintained at the same potential. Also, in this example, the board 44 on which the impedance detection circuit is mounted is put into the shield case 45 so as to make the shield case 45 and the shield 20 at the same potential. Accordingly, the stray capacitance can be prevented from arising between the shield case 45 and the signal line 19, and at the same time the board 44 can be shielded. Further, the device casing 4 containing the shield case 45 is earthed. Therefore, the shield case 45 on which the voltage Vos is applied can be prevented from being superposed by the disturbance noise, and thereby the signal line 19 and the shield case 45 can be maintained at the same potential.

In this way, according to the examples of the impedance detection device, the stray capacitance between the signal line and the outside of the board can be controlled almost accurately. Therefore, in the devices, much more accurate impedance detection can be realized.

The impedance detection circuit, the impedance detection device and the impedance detection method according to the present invention are not limited to the above-mentioned embodiments, and can be embodied in a variety of modifications within the scope of the present invention. Although the capacitive sensor is attached as the impedance element 18 to the end portion of the signal line 19 in the above embodiments, for example, a measurement electrode is formed at the end portion of the signal line 19 so as to detect the capacitance Cs which is formed between the measurement electrode and the object to be measured by the detection circuit or the measurement device.

Also, although the signal line 19 and the shield line 20 is maintained at the same potential by the compensation circuit 13 in the-above-mentioned example, when it is preferable that a certain potential difference is given between the signal line 19 and the shield line 20 due to the usage of the impedance detection circuit and others, the amplitude and the phase of the AC voltage Vin may be adjusted by the compensation circuit 13 if necessary.

Further, the specific structure of the above detection circuit as shown in FIG. 1 is just an example, and other circuit structures are of course applicable. The circuit in which the first operational amplifier 12 and the second operational amplifier 11 comprised in the core unit 1 are respectively replaced by non-inverting amplifiers is applicable, for example.

Also, although the compensation circuit 13 is comprised of the phase adjustment unit 48 and the amplitude adjustment unit 49 in the above-mentioned example, the compensation circuit 13 may comprise a circuit similar to that of the inverting amplification device 2. In this case, as the non-inverting input terminal of the operational amplifier is earthed, a harmonic wave is prevented from being included in the shield voltage, thereby a cause of an error being avoided.

Although the capacitive sensor is used as the impedance element 18 in the above example, an inductive element can be used. Also, when the C-V (capacitance-voltage) characteristic of an element of which capacitance changes depends on voltage is detected, DC voltage may be applied to the bias input terminal 7 while being changed. Since the bias voltage is applied to the opposite side of the capacitive sensor to which the signal line is connected, the voltage Vop itself of the signal line 19 is maintained just as the AC voltage which vibrates around a certain voltage. Therefore, Vc is prevented from being unstable, and thereby a cause of an error of a measured result can be avoided. Although this kind of DC bias generator can be connected to the measurement device from outside, it may also be connected to the bias terminal 23 of the detection circuit in advance and then provided inside the measurement device. Also, the generator provided inside and the generator connected from outside is switched so as to be connected to the bias input terminal 23.

Figure 11:
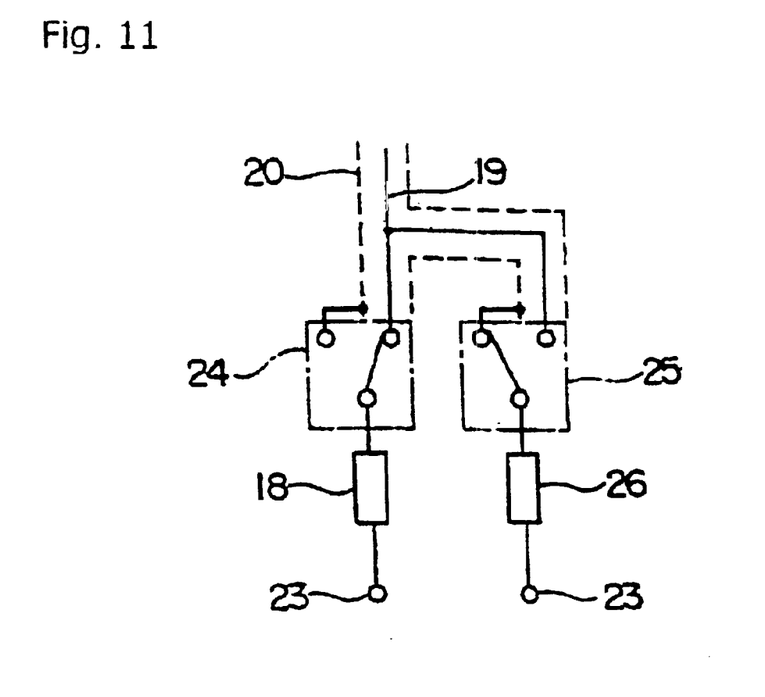
FIG. 11 is a circuit diagram showing one of the other examples of the end portion of a signal line.

Further, although a single impedance element is connected in the above explanation, a plurality of impedance elements may be connected and switched to the element to be measured. FIG. 11 is a diagram showing the end portion of the signal line 19 in this case. When a plurality of impedance elements 18 and 26 are connected, a switch 25 identical to the switch 24 is provided corresponding to each of the impedance elements 18 and 26. And the signal line 19 is connected to one of the secondary side connection terminals of each switch, and the shield 20 is connected to the other of the secondary side connection terminals. The impedance elements 18 and 26 are connected to the primary side connection terminals respectively. When the impedance element 18 is connected to the signal line 19 by the switch 24, the impedance element 26 is connected to the shield 20 by the other switch 25. Also, when the impedance element 26 is connected to the signal line 19 by the switch 25, the impedance element 18 is connected to the shield 20 by the other switch 24. In this way, each switch (switching device) is a multiplexer that can switch measurement elements. Also, this multiplexer may separate both of the impedance elements 18 and 26 from the signal line 19 in case of zero adjustment of the detection circuit, and may connect both of the elements 18, 26 to the signal line 19 depending on the purpose of the detection. This multiplexer can drastically reduce disturbance factors such as stray capacitance by connecting all the switch except the switch connected to the element for the purpose of detection to the shield.

In this way, when the switching device is used, a certain potential between the impedance element and the signal line can be maintained even when the impedance element is separated from the signal line. If the potential difference is zero, for example, the stray capacitance between them can be cancelled. Therefore, refreshment of a circuit such as zero adjustment, reset and initialization can be performed accurately in the impedance detection circuit, for example. Here, when a plurality of switching devices or multiplexers are used, the potential difference between the primary side connection terminal separated from connection and the secondary side connection terminal can be maintained at a certain level even if only necessary impedance elements are selected from a plurality of them at the primary side and connected to the secondary side. Since the stray capacitance between them can be cancelled when the potential difference is zero, for example, an accurate detection is possible even if an element is selected from a plurality of elements to be measured (that is, impedance elements) properly and the impedance value is detected in the impedance detection circuit, for example.

Figure 12:
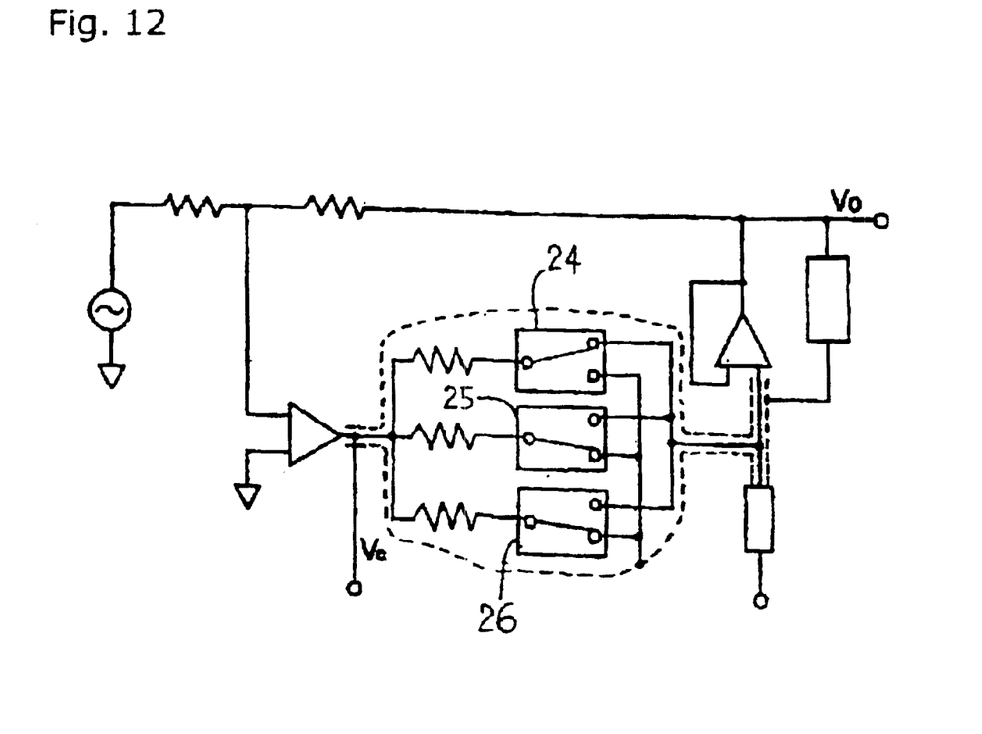
FIG. 12 is a circuit diagram showing an example of the core unit of the impedance detection circuit of one embodiment according to the present invention.
Figure 13:
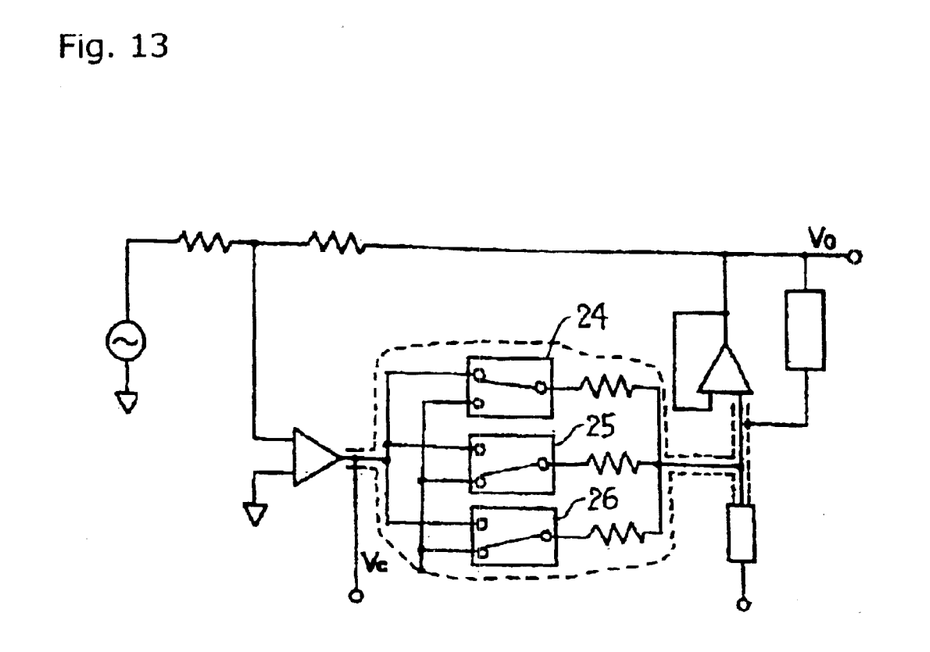
FIG. 13 is a circuit diagram showing an example of the core unit of the impedance detection circuit of one embodiment according to the present invention.

This kind of switch 24 can also be used for switching a gain of the impedance detection circuit. Assume, for example, that instead of the first impedance 17 as shown in FIG. 1, a plurality of resistances (impedances) having different values and the switch 24 as a selecting device for each resistance (impedance) are connected between the signal line and a plurality of resistances. As shown in FIG. 12, one end of each resistance is connected to the output terminal of the first operational amplifier 12, while the other end of each resistance is connected to the primary side connection terminal of the switch 24. Also, one terminal of the secondary side connection terminals is connected to the signal line, and the other terminal thereof is connected to the shield 20. The impedances selected by these selecting devices become a composite impedance and not-selected resistances are connected to the shield 20. In this way, the selecting device that controls each of the switches 24 is a multiplexer. As a result, the stray capacitance which arises between the unconnected resistance and the signal line or the shield can be controlled. Therefore, it is possible to change the potential difference applied to the impedance element without preventing the highly accurate detection of the capacitance Cs, and as a result, a gain can be switched. Also, as shown in FIG. 13, the switch may be connected between the first operational amplifier 12 and the first impedance 17.

Figure 14:
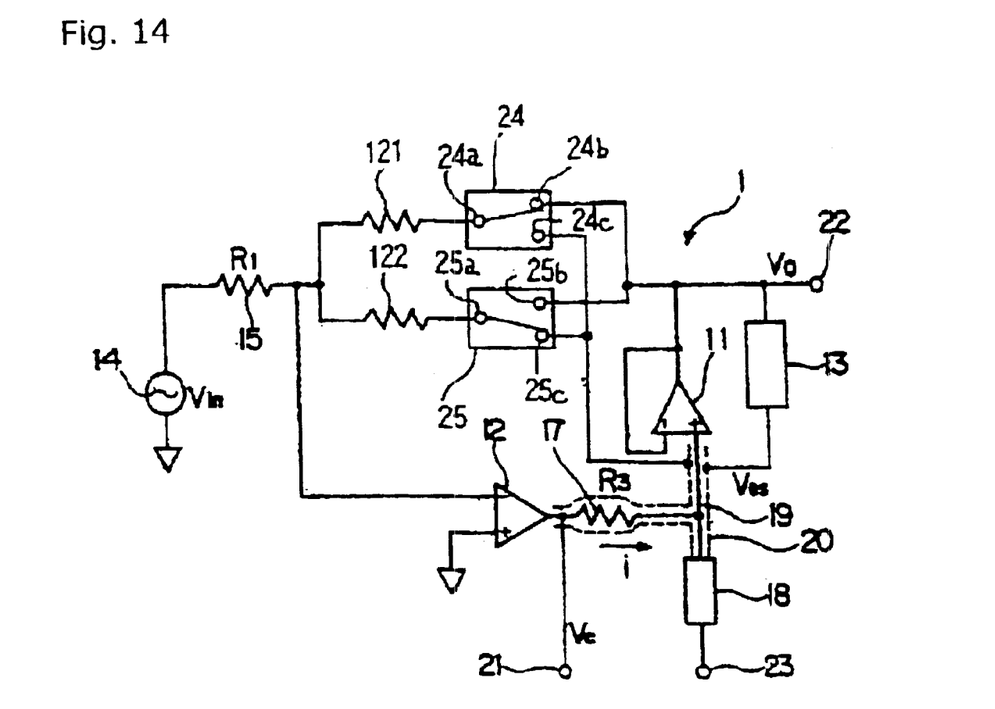
FIG. 14 is a circuit diagram showing an example of the core unit of the impedance detection circuit of one embodiment according to the present invention.

On the other hand, similarly to the above, a plurality of resistances 121 and 122 having different resistance values and the switch 24 and 25 corresponding to respective resistances may be connected as selecting devices, for example, as shown in FIG. 14, instead of the second resistance 16 as shown in FIG. 1. Or, although it is not illustrated here, this case can be applied to the first resistance 15 and others. In this way, the resistances to be connected to the circuit may be selected from a plurality of resistances having different resistance values by using these selecting devices, and not-selected resistances may be connected to the shield, thereby an accurate range switch being possible depending on an object to be detected or a measurement condition.

In this way, by using the selecting devices or the multiplexer, the potential between the non-selected impedance separated from the connection and the selected impedance or the terminal to be connected can be maintained at a certain level when impedance is selected if necessary among a plurality of impedances provided in the circuit. Therefore, a range switch can be performed depending on an object to be detected under the condition that stray capacitance of non-selected impedance is cancelled, and as a result, a highly accurate detection is possible by changing the amplification characteristic of the impedance detection circuit accurately.

In the examples of the switching device or the selecting device, the switch is shown as a switch for switching among three terminals, one terminal of the primary side connection terminal and two terminals of the secondary side connection terminal. This is applicable to the case that the primary side connection terminal has two or more terminals and the secondary side connection terminal that is to be switched and connected has three or more terminals. In such a case, it is satisfactory when at least one of the terminals of the secondary side connection terminals that is to be switched and connected is connected to the shield, and a terminal to which the primary side connection terminal is connected can be switched among the terminal and the other terminals of the secondary side connection terminal. Also, although the switch is illustrated as a switch in the example, any other conceivable device may be replaced with it.

Here, the signal line 19 may be covered by double or triple shields. The outside shield line is connected to the shield terminal 6 when the length of the double shield cable is 50 cm or longer in this example. However, when the first operational amplifier 12 is a power type that can obtain sufficient current, the outside shield of the length corresponding to the power, even if it is 50 cm or longer, can be connected to the earth terminal 8.

Although the above is a detailed description and explanation of the present invention, it is clearly understood that what is described above is just for explanation and as examples of embodiment, not a limited one. The spirit and scope of the present invention is only limited by the terminology of claims attached hereto.

What is claimed is:

1. An impedance detection circuit comprising:
    a voltage follower;
    a first operational amplifier;
    a signal line of which one end is connected to an input terminal of the voltage follower and the other end is connected to an impedance element;
    a shield that shields electrically at least a part of the signal line;
    a shield voltage applying device that applies shield voltage to the shield;
    a first impedance that is connected between an output terminal of the first operational amplifier and the signal line;
    the voltage follower and the first impedance being connected in a feedback loop of the first operational amplifier; and
    a signal output terminal that is connected to the output terminal of the first operational amplifier.

2. An impedance detection circuit comprising:
    a first operational amplifier;
    a second operational amplifier of which both input terminals are in an imaginary short status;
    a signal line of which one end is connected to an input terminal of the second operational amplifier and the other end is connected to an impedance element;
    a shield that shields electrically at least a part of the signal line;
    a first impedance that is connected between an output terminal of the first operational amplifier and the signal line;
    the second amplifier and the first impedance being connected in a feedback loop of the first operational amplifier; and
    a signal output terminal that is connected to the output terminal of the first operational amplifier.

3. The impedance detection circuit according to claim 2, wherein a shield voltage applying device is further connected to the shield.

4. The impedance detection circuit according to claim 1 or 3, wherein the shield voltage applying device includes a phase amplitude compensation device.

5. The impedance detection circuit according to claim 1 or 2, wherein an input terminal of the first operational amplifier is connected to a specified first voltage.

6. The impedance detection circuit according to any of claim 1 or 2 further comprising:
    a cancel device that removes the output voltage of the voltage follower or the second operational amplifier from the output voltage of the signal output terminal.

7. The impedance detection circuit according to claim 6, wherein the cancel device includes:
    an inverting amplification unit that inverts one voltage of the two output voltages using a third operational amplifier; and
    an addition unit that adds the other voltage of the two output voltages and the output voltage of the inverting amplification unit,
    wherein one of the input terminals of the third operational amplifier is connected to a specified first voltage.

8. The impedance detection circuit according to claim 7, wherein the inverting amplification unit includes a phase amplitude compensation device.

9. The impedance detection circuit according to claim 6, wherein the cancel device includes:
    an inverting amplification unit that inverts one voltage of the two output voltages; and
    an addition unit that adds the other voltage of the two output voltages and the output voltage of the inverting amplification unit by using a fourth operational amplifier,
    wherein one of the input terminals of the fourth operational amplifier is connected to a specified first voltage.

10. The impedance detection circuit according to claim 6, wherein the cancel device includes a subtraction unit whose inputs are the two output voltages.

11. The impedance detection circuit according to claim 10,
    wherein the subtraction unit includes a fifth operational amplifier,
    wherein one of the input terminals of the fifth operational amplifier is connected to a specified first voltage.

12. The impedance detection circuit according to any of claim 1 or 2, wherein a bias is provided that can superpose at least any of direct current bias or alternate current bias on an impedance element connected to the signal line.

13. The impedance detection circuit according to any of claim 1 or 2, wherein the non-inverting input terminal of the voltage follower or the second operational amplifier and the signal line are connected.

14. The impedance detection circuit according to any of claim 1 or 2 further comprising:
    a switching device including a primary side connection terminal having at least one terminal and a secondary side connection terminal having at least two terminals,
    wherein the primary side connection terminal of the switching device is connected at least to an impedance element, and the secondary side connection terminal is connected at least to the signal line and the shield, and
    the terminal to which the primary side connection terminal is connected varies among the terminals of the secondary side connection terminal.

15. The impedance detection circuit according to claim 14 further comprising:
    a plurality of the switching devices.

16. The impedance detection circuit according to any of claim 1 or 2 further comprising:
    the first impedance including a plurality of impedances; and
    a selecting device that selects at least one of the plurality of impedances,
    wherein the selecting device includes a primary side connection terminal having at least one terminal and a secondary side connection terminal having at least two terminals,
    the primary side connection terminal is connected at least to the impedance,
    the secondary side connection terminal is connected at least to the shield, and the connection of the primary side connection terminal varies among the terminals of the secondary side connection terminal.

17. The impedance detection circuit according to claim 16, wherein the selecting device is located at least either between the first impedance and the signal line or between the first impedance and the signal output terminal.

18. The impedance detection circuit according to any of claim 1 or 2, wherein the first impedance is resistance or capacitance.

19. The impedance detection circuit according to any of claim 1 or 2, wherein the shield includes double or more shield part.

20. An impedance detection device comprising:
the impedance detection circuit according to any of claim 1 or 2; and
a terminal that can connect the impedance element to the signal line from outside.

21. An impedance detection device comprising:
the impedance detection circuit according to any of claim 1 or 2; and
a shield that shields electrically at least a part of a board on which the impedance detection circuit is mounted,
wherein the shield voltage is applied to the shield.

22. An impedance detection method including steps for,
connecting an input terminal of a voltage follower to a signal line and making a condition that there is neither input nor output of current at the input terminal;
applying a shield voltage based on an output voltage of the voltage follower to a shield of at least a part of the signal line, and
detecting an impedance of an impedance element by a current that is supplied by a first operational amplifier and that flows through a first impedance connected to the signal line; and
wherein the voltage follower and the first impedance are connected in a feedback loop of said first operational amplifier.

23. An impedance detection method including steps for:
making both input terminals of a second operational amplifier imaginary short;
connecting one of the input terminals to a signal line and making a condition that there is neither input nor output of current at the input terminal;
connecting another input terminal to a shield of at least a part of the signal line; and
detecting an impedance of an impedance element by a current that is supplied by a first operational amplifier and that flows through a first impedance connected to the signal line; and
wherein the second operational amplifier and the first impedance are connected in a feedback loop of said first operational amplifier.

24. The impedance detection method according to claim 23, wherein a shield voltage is applied to the shield.

25. The impedance detection method according to claim 22 or 24, wherein the shield voltage is the voltage which is compensated in phase and amplitude and applied to the shield.

26. The impedance detection method according to any of claim 22 or 23,
wherein the output of the voltage follower or the output of the second operational amplifier is subtracted from the detection signal of the impedance element.

27. The impedance detection method according to any of claim 22 or 23,
wherein at least either direct current bias or alternate current bias is applied to the impedance element connected to the signal line.

28. The impedance detection method according to any of claim 22 or 23,
wherein a terminal to which the impedance element is connected is switched from the signal line to the shield so as to initialize.

29. The impedance detection method according to any of claim 22 or 23,
wherein the value of the first impedance is changed so as to change the potential difference imposed on the first impedance and a gain.

* * * * *